United States Patent [19]

Tokumitsu

[11] Patent Number: 4,594,516

[45] Date of Patent: Jun. 10, 1986

[54] SAMPLING PULSE GENERATOR

[75] Inventor: Shigenori Tokumitsu, Fukaya, Japan

[73] Assignee: Tokyo Shibaura Denki Kabushiki Kaisha, Kawasaki, Japan

[21] Appl. No.: 517,743

[22] Filed: Jul. 27, 1983

[30] Foreign Application Priority Data

Jul. 30, 1982 [JP] Japan .................. 59-133572

[51] Int. Cl.$^4$ ............... H03K 5/13; H03L 7/00
[52] U.S. Cl. .................................. 307/269; 307/262;
 307/511; 307/518; 328/109; 328/155; 377/126;
 377/106; 377/43
[58] Field of Search ............... 307/262, 271, 269, 511,
 307/518, 522, 523, 526, 527, 528, 529; 377/126,
 107, 43, 46, 47, 48; 331/1 A, 25; 329/107, 126;
 328/155, 14, 109

[56] References Cited

U.S. PATENT DOCUMENTS

| | | | |
|---|---|---|---|
| 3,069,568 | 12/1962 | Day, Jr. ........................ | 377/107 |
| 3,263,066 | 7/1966 | Seegmiller ........................ | 377/43 |
| 3,646,452 | 2/1972 | Horowitz et al. ................ | 328/63 |
| 3,833,854 | 9/1974 | Schonover ........................ | 328/155 |
| 3,851,257 | 11/1974 | Boersma ........................ | 328/63 |
| 3,870,970 | 3/1975 | Chibana ........................ | 331/25 |
| 4,057,768 | 11/1977 | Juliusburger et al. ............ | 331/1 A |
| 4,086,471 | 8/1978 | Takahashi ........................ | 235/92 DM |

FOREIGN PATENT DOCUMENTS

| | | |
|---|---|---|
| 2207275 | 9/1972 | Fed. Rep. of Germany . |
| 2301315 | 7/1976 | Fed. Rep. of Germany . |
| 2745460 | 10/1977 | Fed. Rep. of Germany . |
| 1366472 | 9/1974 | United Kingdom . |

Primary Examiner—Stanley D. Miller
Assistant Examiner—R. R. Roseen
Attorney, Agent, or Firm—Cushman, Darby & Cushman

[57] ABSTRACT

A first 5-stage ring counter generates a signal having a frequency of $(4/5)f_{SC}$ by dividing a frequency $8f_{SC}$ of a signal. A second 5-stage ring counter generates a signal having a frequency of $(4/5)f_{SC}$ by dividing a frequency of a signal obtained by inverting the signal of frequency $8f_{SC}$ by an inverter. A first sampling pulse output circuit generates a first sampling pulse from an output signal from the first 5-stage ring counter. A second sampling pulse output circuit generates a second sampling pulse from an output signal from the second 5-stage ring counter. A phase correction circuit causes synchronization of the count operation of the first 5-stage ring counter with a clock run-in signal. This phase correction is performed by shifting the phase of the output from the first 5-stage ring counter in units of the period of the signal of frequency $8f_{SC}$. When this phase correction is completed, the output signal from the first 5-stage ring counter is synchronized with the clock run-in signal such that the output signal is delayed by between 0 and 35 nsec with respect to the phase of the clock run-in signal. A discriminator divides a range of 0 to 35 nsec into two discrimination periods of 17.5 nsec each. The discriminator then discriminates during which one of the two discrimination periods the output signal from the first 5-stage ring counter appears. The discriminator then controls a sampling pulse switching circuit in accordance with the discrimination result.

2 Claims, 29 Drawing Figures

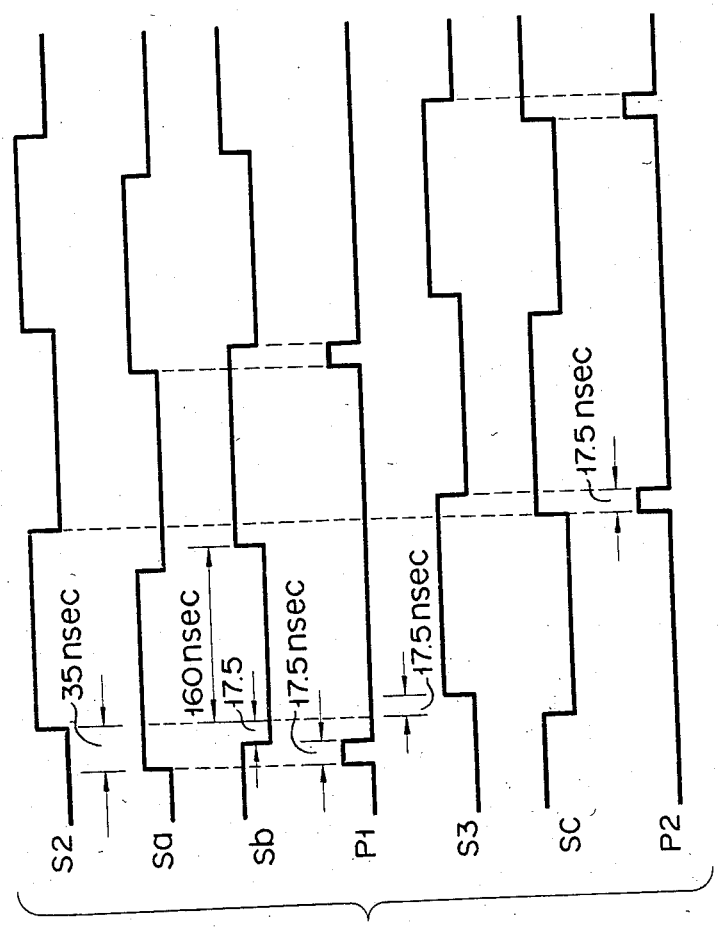

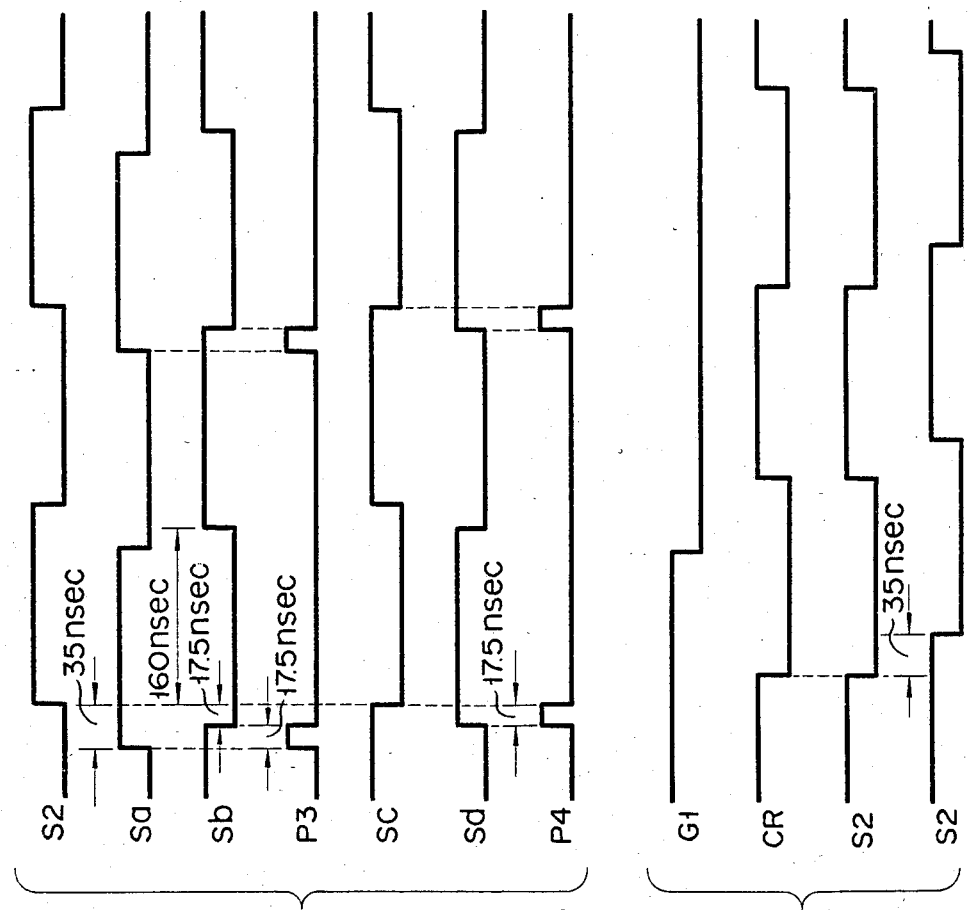

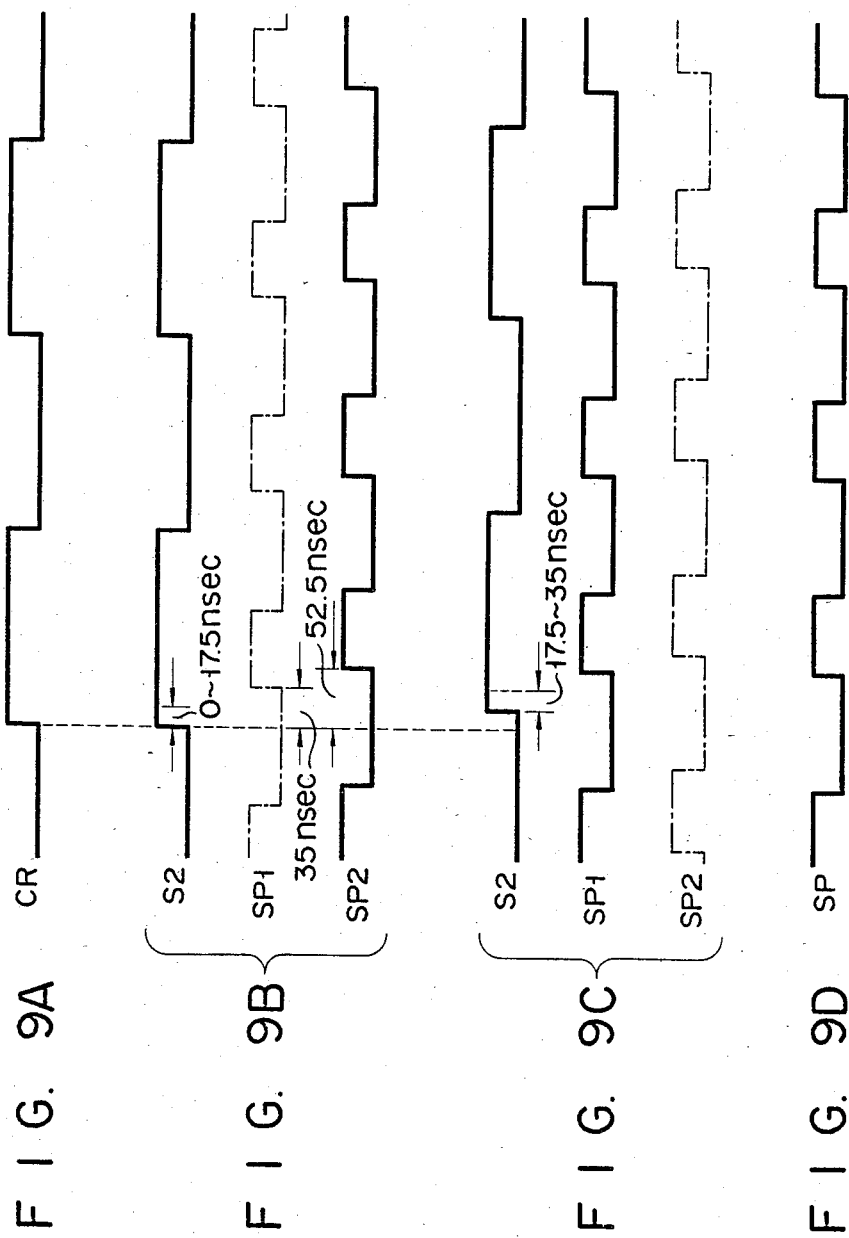

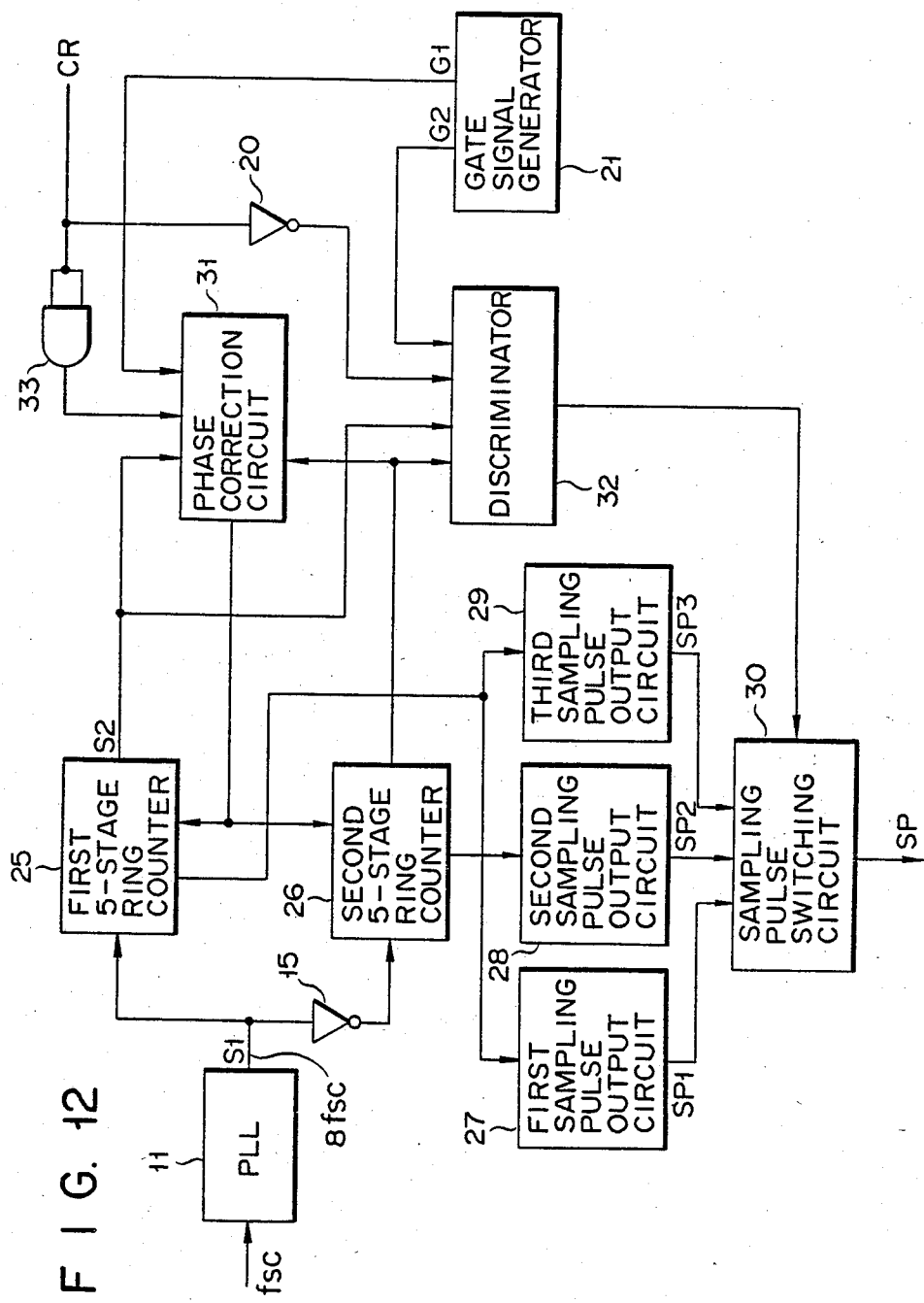
F I G. 12

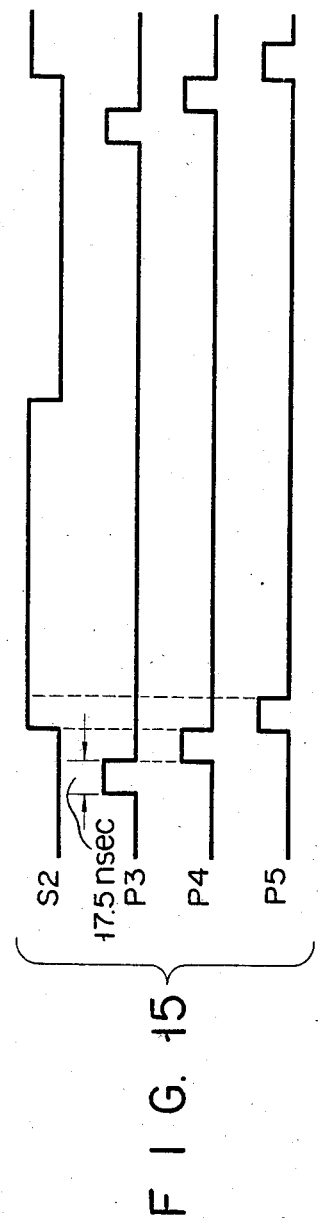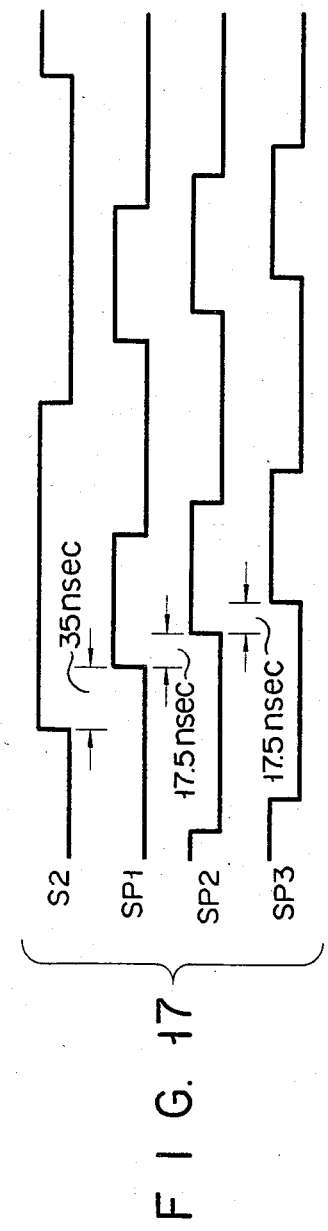

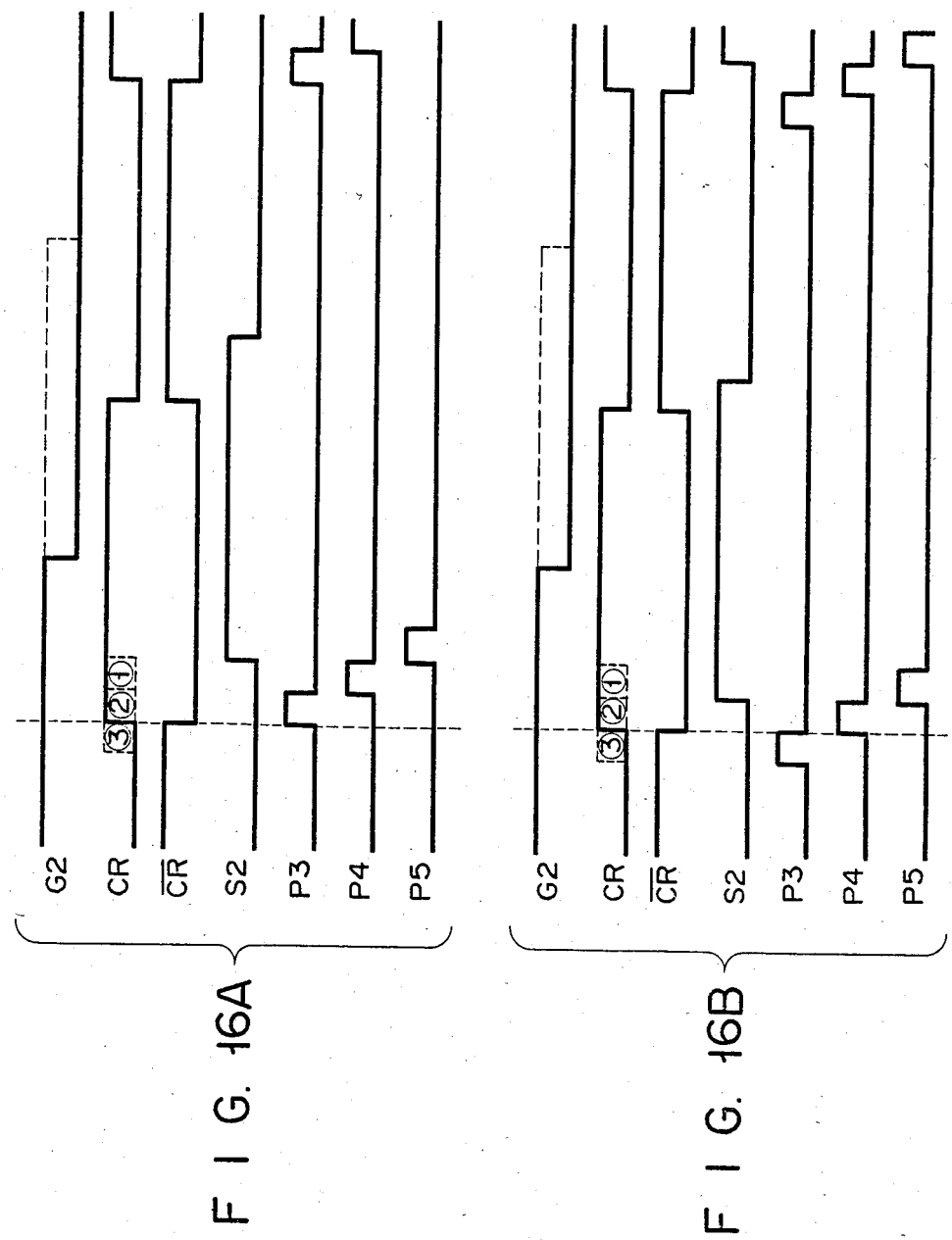

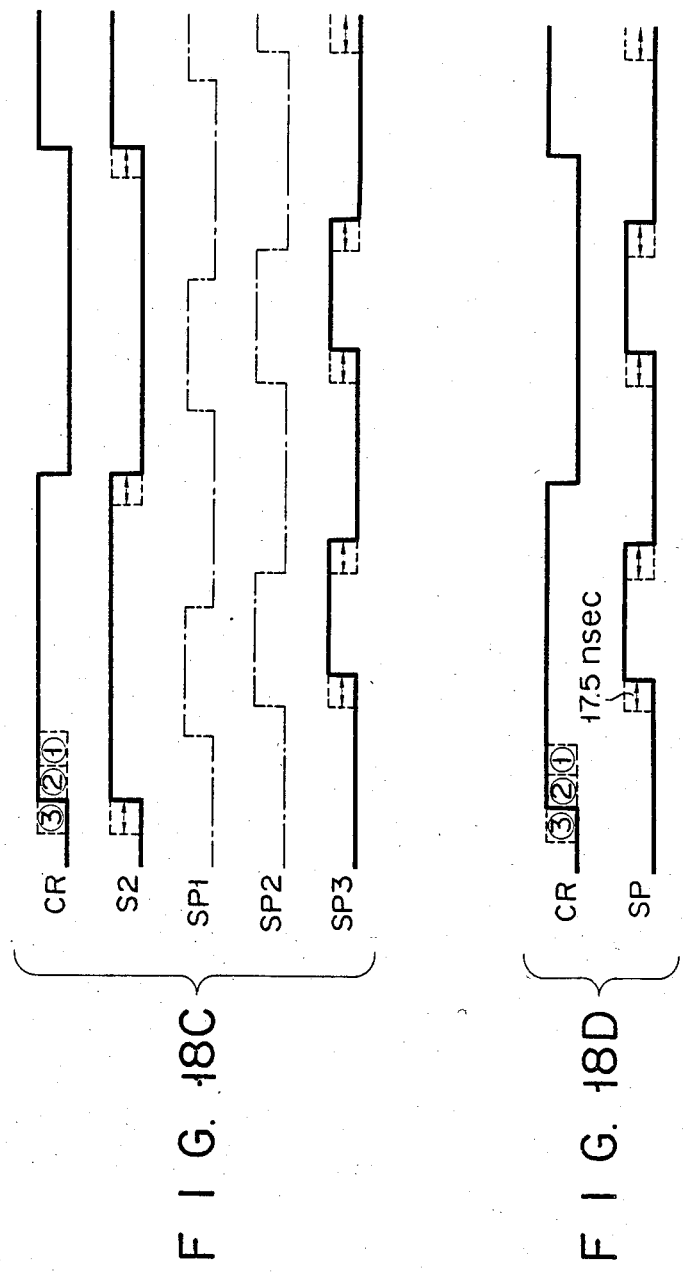

SAMPLING PULSE GENERATOR

BACKGROUND OF THE INVENTION

The present invention relates to a sampling pulse generator for generating a sampling pulse for sampling a character signal on a television signal.

In a character/TV signal multiplex broadcasting system, character information is transmitted from a broadcasting station to a receiving end, using the television signal, and this character information is reproduced at the receiving end. The character information is superimposed as the character signal during a predetermined horizontal scan period of a vertical blanking period.

The character signal comprises a clock run-in signal, a framing code, and a data portion including the actual character data and control data. The clock run-in signal indicates a reference phase of the character signal. The framing code is used for frame synchronization.

A character/TV signal multiplex reception apparatus separates the character signal from the television signal. The separated character signal is sampled and written in a buffer memory. Predetermined processing is performed for the data written in the buffer memory, thereby obtaining picture data to be supplied to a CRT monitor.

The sampling pulse for sampling the character signal has a frequency $(8/5)f_{SC}$ (where $f_{SC}$ is the frequency of the chrominance subcarrier signal) which is the same as the bit rate of the character signal. The sampling pulse is generally prepared by synchronizing a free run pulse also having a frequency of $(8/5)f_{SC}$ to the clock run-in signal.

A sampling generator shown in the text book used at the conference of the Insititute of Television Engineers' of Japan; the Character TV broadcasting & CAPTAIN system, (4) A receiver for the character TV broadcasting, (June 16-17, 1981) is used to generate the above-mentioned sampling pulse. This sampling pulse generator has a 5-stage ring counter. This ring counter is driven by a clock pulse having a frequency of $8f_{SC}$ (one period: 35 nsec). Therefore, the frequency of a count output from the ring counter is the same as that $[(4/5)f_{SC}]$ (one period: 350 nsec) of the clock run-in signal. The count output is doubled to obtain a pulse having a frequency equal to that $[(8/5)f_{SC}]$ (one period: 175 nsec) of the sampling pulse. In order to use the doubled output as the sampling pulse, the counting operation of the ring counter is phase-corrected to be synchronized with the clock run-in signal. This can be performed by shifting the phase of the count output in units of one period (35 nsec) of the clock run-in signal.

However, the following problem is present in the sampling pulse generator described above. The phase of the character signal is discrete throughout each horizontal scan period. The phase is shifted within a range of about $\pm 0.35$ $\mu$sec. When the phase of the clock run-in signal (CR) is shifted, phase correction as described above is performed. Therefore, the phase of the count output from the ring counter is shifted in units of 35 nsec, and hence the phase of the sampling pulse is also shifted in units of 35 nsec. In other words, the sampling pulse has jitter of 35 nsec. Since the jitter of the sampling pulse results in an error of sampled data, it must be as small as possible. For example, even if a change in phase of the clock run-in signal is small, the phase of the pulse is shifted by 35 nsec. As a result, the character signal cannot be sampled at an optimum sampling phase.

In order to prevent this problem, it is proposed that the frequency of the clock signal for driving the ring counter be made higher than $8f_{SC}$. However, it is undesirable to increase the frequency of the clock signal from the viewpoint of the operating speed of the circuit elements. Furthermore, when the frequency of the clock signal is increased, the number of stages of the ring counter must be increased. As a result, when a phase difference between the clock run-in signal and the count output from the ring counter is great, phase correction cannot be completed within the period of the clock run-in signal.

SUMMARY OF THE INVENTION

It is an object of the present invention to provide a sampling pulse generator wherein the frequency of a clock signal for driving a ring counter need not be increased, and a jitter of a sampling pulse can be decreased.

In order to achieve the above object of the present invention, there is provided a novel sampling pulse generator comprising:

signal output means for generating a first signal having a predetermined frequency;

a first ring counter driven by the first signal so as to produce a second signal obtained by frequency-dividing the first signal at a predetermined frequency dividing ratio;

inverting means for inverting the first signal;

a second ring counter driven by an inverted signal from said inverting means so as to produce a third signal obtained by frequency-dividing the inverted signal at a predetermined frequency dividing ratio;

sampling pulse output means for producing a plurality of sampling pulses for sampling a signal to be sampled, the sampling pulses being obtained using the second and third signals such that the sampling pulses are phase-shifted by half a period of the first signal;

pulse generating means for generating a pulse having a predetermined level during a predetermined period of the signal to be sampled;

phase correcting means for performing phase correction so as to synchronize a count operation of said first and second ring counters with the signal to be sampled during a period of the pulse from said pulse generating means, the phase correction being performed such that the phases of the second and third signals are shifted in units of the period of the first signal so as to cause the second and third signals to have a predetermined phase relationship between them, and each to have a predetermined phase relationship with the signal to be sampled;

discriminating means for setting a plurality of discrimination periods obtained by dividing a maximum phase error against the latter predetermined relationship between the second or the third signal and the signal to be sampled by half the period of the first signal when the phase correction by said phase correcting means is completed, and for discriminatihg which one of the plurality of discrimination periods corresponds to a phase-corrected second signal or a phase-corrected third signal; and sampling pulse selecting means for selecting a sampling pulse among the plurality of sampling pulses which has an optimal phase for sampling the signal to be sampled according to a discrimination result.

BRIEF DESCRIPTION OF THE DRAWINGS

FIG. 5 is a timing chart for explaining the operation of a phase correction circuit shown in FIGS. 1 and 2;

FIG. 6 is a timing chart for explaining the operation of the phase correction circuit shown in FIGS. 1 and 2;

FIG. 7 is a timing chart for explaining the operation of a discriminator shown in FIGS. 1 and 2;

FIGS. 9A to 9D show timing charts for explaining the operation of a sampling pulse switching circuit shown in FIGS. 1 and 2;

FIG. 12 is a block diagram of a sampling pulse generator according to a second embodiment of the present invention;

FIG. 15 is a timing chart for explaining the operation of a discriminator shown in FIGS. 12 and 13;

FIGS. 16A to 16D show timing charts for explaining the operation of the discriminator shown in FIGS. 12 and 13;

FIG. 17 is a timing chart of sampling pulses from sampling pulse output circuits; and FIGS. 18A to 18D show timing charts for explaining the operation of a sampling pulse switching circuit shown in FIGS. 12 and 13.

DETAILED DESCRIPTION OF THE PREFERRED EMBODIMENTS

Preferred embodiments of the present invention will now be described with reference to the accompanying drawings.

Figure 1:
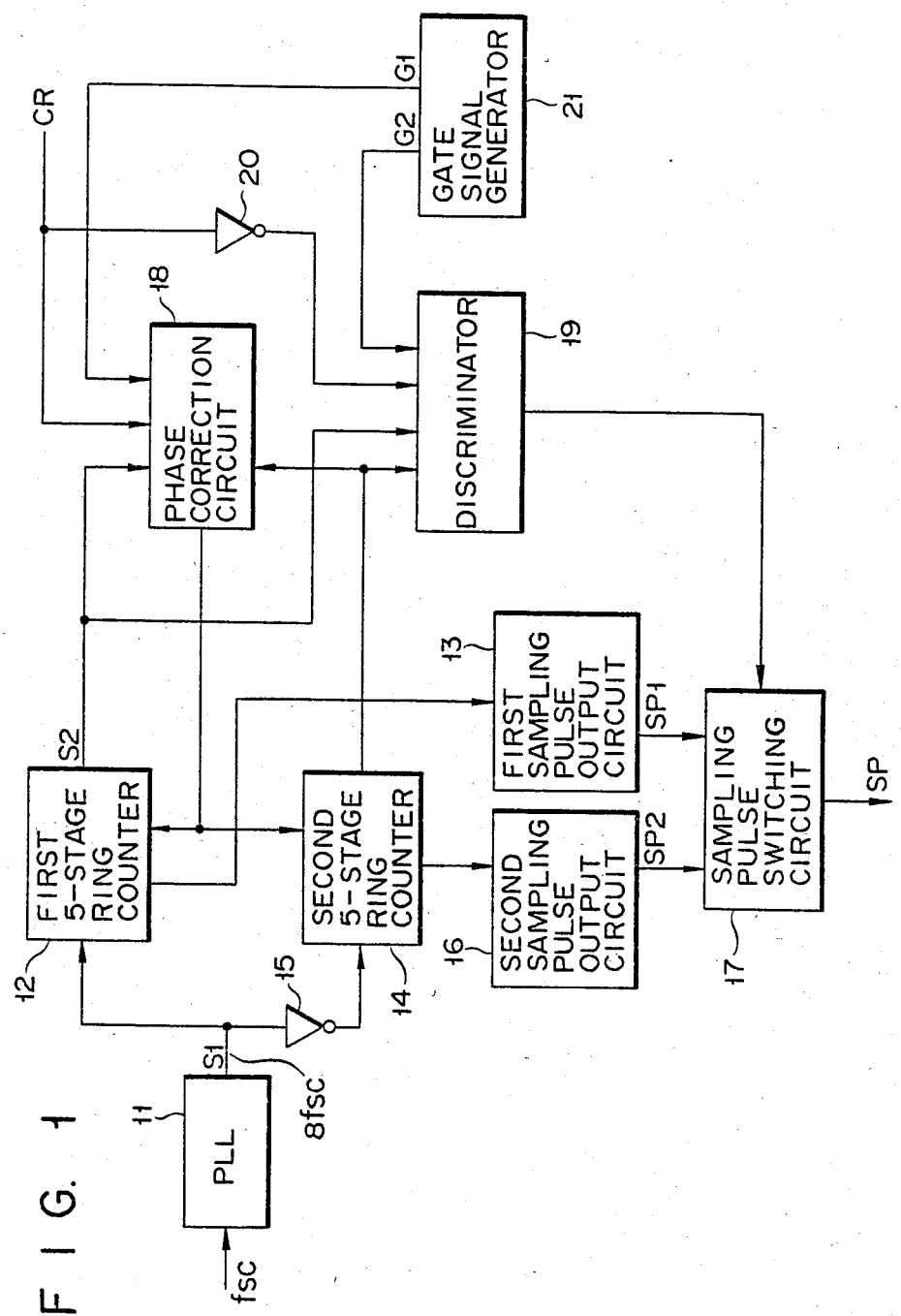
FIG. 1 is a block diagram of a sampling pulse generator according to a first embodiment of the present invention.
Figure 2:
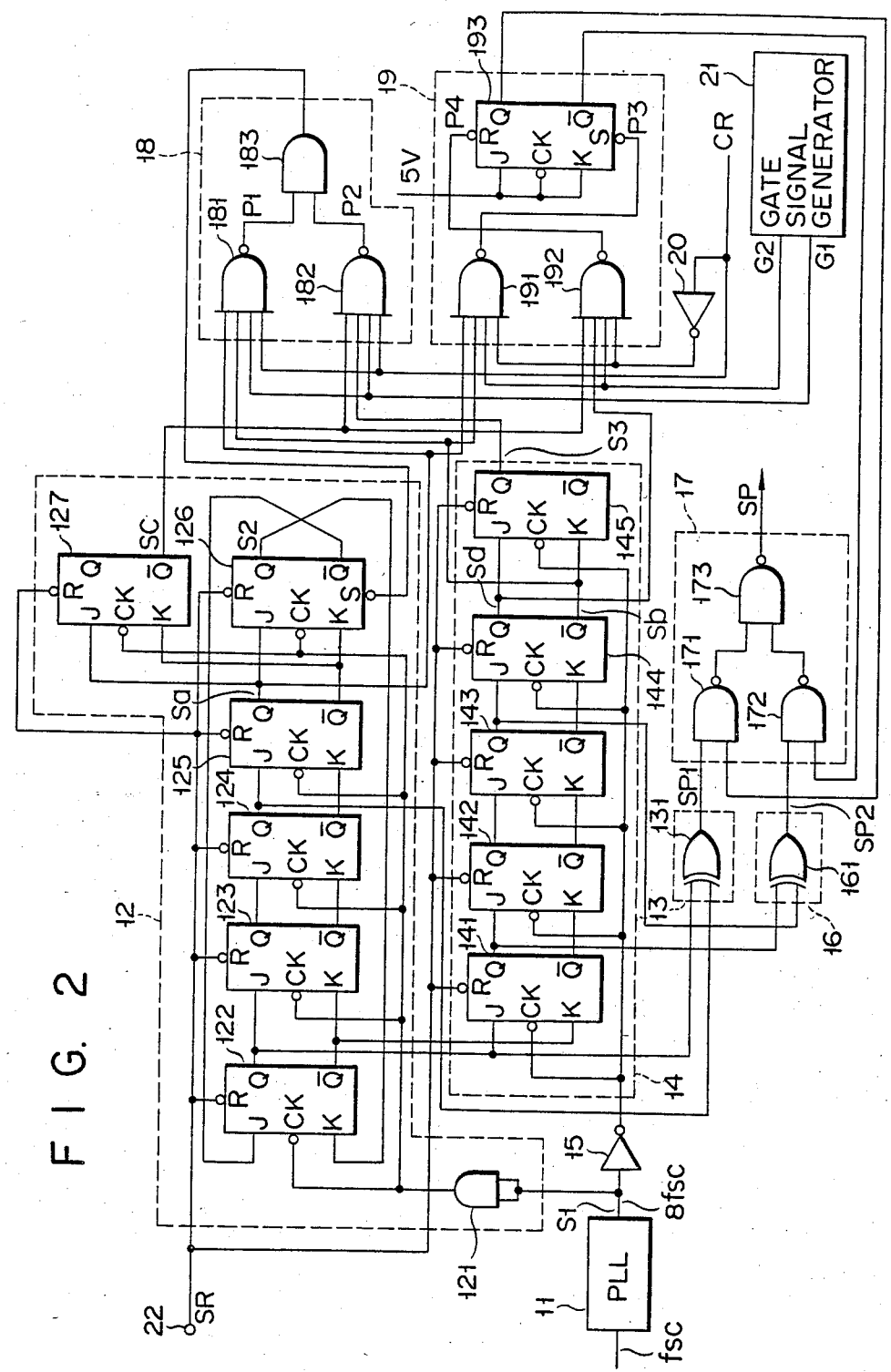
FIG. 2 is a circuit diagram showing the detailed configuration of the sampling pulse generator shown in FIG. 1.

FIG. 1 is a block diagram of a sampling pulse generator according to a first embodiment of the present invention, and FIG. 2 is a circuit diagram showing the detailed configuration thereof. The configuration and operation of the circuit shown in FIG. 1 will be described with reference to FIG. 2 for best understanding of the present invention.

Figure 3:
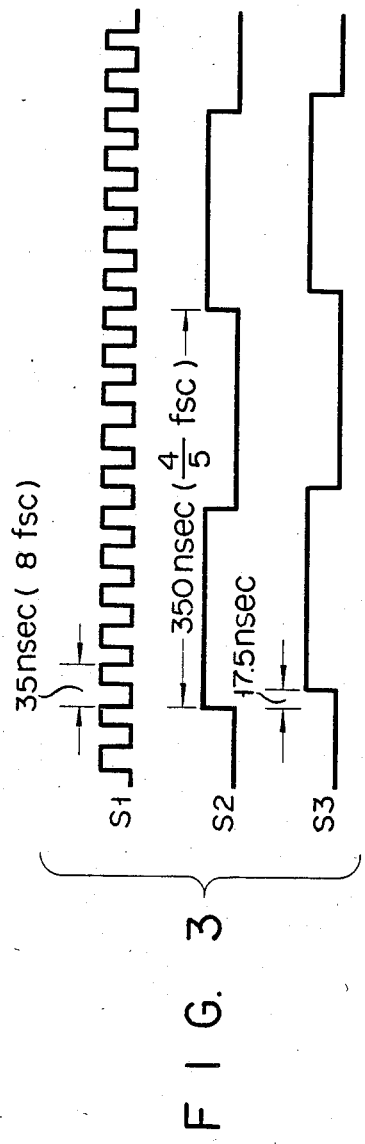
FIG. 3 is a timing chart for explaining the operation of ring counters shown in FIGS. 1 and 2.

Referring to FIGS. 1 and 2, reference numeral 11 denotes a phase-locked loop circuit (to be referred to as a PLL 11 hereinafter). The PLL 11 receives a signal having a frequency of $f_{SC}$ and generates a signal S1 having a frequency of $8f_{SC}$ (one period: 35 nsec). The signal S1 is supplied to a first 5-stage ring counter 12. The ring counter 12 comprises an AND gate 121, and JK flip-flops 122 to 127. The JK flip-flops 122 to 127 receive as a clock signal the signal S1 from the PLL 11 through the AND gate 121, and respectively generate signals having a frequency of $(4/5)f_{SC}$ (one period: 350 nsec). In this case, the output signals of the JK flip-flops 122 to 126 are phase-shifted by 35 nsec with respect to one another. Only the output signal S2 of the JK flip-flop 126 is shown in FIG. 3 as a typical output signal. It should be noted that the JK flip-flop 127 is arranged to supply the output signal from the ring counter 12 to a phase correction circuit 18 and a discriminator 19 (to be described later).

A first sampling pulse output circuit 13 comprises an exclusive OR gate 131. Output signals from terminals Q of the JK flip-flops 122 and 124 are caused to have an exclusive-OR output by the exclusive OR gate 131, thereby producing a first sampling pulse SP1 having a frequency of $(8/5)f_{SC}$ (one period: 175 nsec).

A second 5-stage ring counter 14 comprises JK flip-flops 141 to 145. In this case, terminals J and K of the first JK flip-flop 141 receive output signals from the terminal Q and a terminal $\overline{Q}$ of the first JK flip-flop 122, respectively. The JK flip-flops 141 to 145 receive as a clock signal a signal obtained by inverting the signal S1 by an inverter 15. Therefore, the output signals from the JK flip-flops 141 to 145 are delayed by half (17.5 nsec) the period of the signal S1 from the output signals from the JK flip-flops 122 to 126, respectively. In this case, the output signals of JK flip-flops 141 to 145 are phase-shifted by 35 nsec with respect to one another, and only the output signal S3 of the terminal Q of the flip-flop 145 is shown in FIG. 3 as a typical output signal.

A second sampling pulse output circuit 16 comprises an exclusive OR gate 161. Output signals from terminals Q of the JK flip-flops 141 and 143 are given an exclusive-OR output by the exclusive OR gate 161, thereby obtaining a second sampling pulse SP2 having a frequency $(8/5)f_{SC}$. The second sampling pulse SP2 is delayed by 17.5 nsec from the first sampling pulse SP1.

Reference numeral 17 denotes a sampling pulse switching circuit for switching the first and second sampling pulses SP1 and SP2 from the first and second sampling pulse output circuits 13 and 16. The sampling pulse switching circuit 17 comprises NAND gates 171 to 173. The switching operation of the sampling pulse switching circuit 17 is controlled by the discriminator 19 to be described later.

The phase correction circuit 18 comprises NAND gates 181, 182 and an AND gate 183. The NAND gate 181 receives an output signal Sa from a terminal Q of the JK flip-flop 125 and an output signal Sb from a terminal $\overline{Q}$ of the flip-flop 144. The NAND gate 182 receives an output signal Sc from a terminal $\overline{Q}$ of the JK flip-flop 127 and the output signal S3 from the terminal Q of the flip-flop 144.

Figure 4:
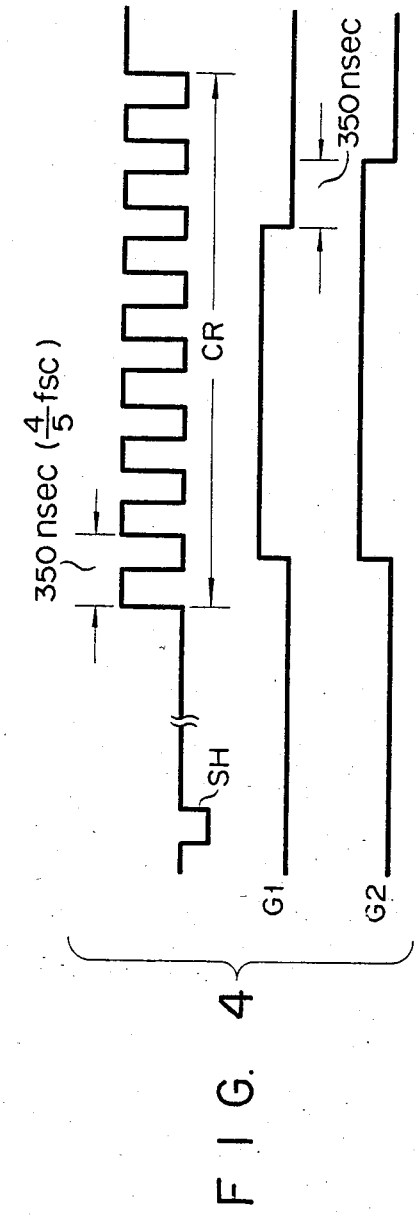
FIG. 4 is a timing chart for explaining first and second clock run-in gate signals G1 and G2.

Furthermore, NAND gates 181 and 182 receive the clock run-in signal and a first clock run-in gate signal G1. The first clock run-in gate signal G1 has a logic level "H" during five periods of the clock run-in signal CR, as shown in FIG. 4. In this case, the first clock run-in gate signal G1 is preset to rise at a logic level "0" period of the clock run-in signal CR and fall at a logic level "0" period of the fifth period of the clock run-in signal CR.

A phase of the output signal Sa is advanced from that of the output signal S2 by 35 nsec, as shown in FIG. 5.

A phase of the output signal Sb is delayed from that of the output signal S2 by 160 nsec, as shown in FIG. 5. Accordingly, the NAND gate 181 can produce a pulse P1 in front of the output signal S2, as shown in FIG. 5. This pulse P1 is to be referred to as a leading pulse. Similarly, the NAND gate 182 can produce a pulse P2 behind of the output signal S2 using the output signal S3 and Sc. This pulse P2 is to be referred to as a trailing pulse.

Whether those pulses P1 and P2 are output respectively from the NAND gates 181 and 182 depends on a phase state of the clock run-in signal (CR). This operation is done during a logic level "1" period of the first clock run-in gate signal G1.

These pulses P1 and P2 are supplied as a set signal to set terminal S of the JK flip-flop 126 through the AND gate 183.

The phase correction circuit 18 compares the phase of the output signal from the ring counter 12 with the phase of the clock run-in signal CR. The phase correction circuit 18 then performs phase correction so as to synchronize the counting operation of the ring counters 12 and 14 with the clock run-in signal CR in accordance with the comparison result.

The discriminator 19 comprises NAND gates 191 and 192 and a JK flip-flop 193. The NAND gate 191 receives the output signal Sa from the terminal Q of the JK flip-flop 125 and the output signal Sb from the terminal $\overline{Q}$ of the JK flip-flop 144. The NAND gate 192 receives the output signal Sc from the terminal $\overline{Q}$ of the JK flip-flop 127 and an output signal Sd from the terminal Q of the JK flip-flop 144.

Furthermore, NAND gates 191 and 192 receive a signal $\overline{CR}$ obtained by inverting the clock run-in signal CR by an inverter 20, and a second clock run-in gate signal G2. This second clock run-in gate signal G2 is preset to fall with a delay of 350 nsec from the first clock run-in gate signal G1, as shown in FIG. 4.

The NAND gate 191 can produce a pulse P3 having the same phase as that of the leading pulse P1 from the NAND gate 181, as shown in FIG. 6.

A phase of the output signal Sc is opposite to that of the output signal S2, as shown in FIG. 6. A phase of the output signal Sd is advanced from that of the output signal S2 by 17.5 nsec, as shown in FIG. 6. Accordingly, the NAND gate 192 can produce a pulse P4 in front of the output signal S2, as shown in FIG. 6.

Whether those pulses P3 and P4 are output respectively from the NAND gates 191 and 192 depends on a phase error between the output signal S2 and clock run-in signal CR after phase correction operation. This operation is done during a logic level "1" period of the second clock run-in gate signal G2.

The pulse P3 is supplied to a set terminal S of the JK flip-flop 193, and the pulse P4 is supplied to reset terminal R of the JK flip-flop 193. DC voltage of 5 V is supplied to terminals J, K and CK of the JK flip-flop 193. An output signals from terminals Q and $\overline{Q}$ of the JK flip-flop 193 are supplied to the NAND gate 171 and 172 of the sampling pulse switching circuit 17, respectively.

The discriminator 19 discriminates a state wherein the output signals (from the ring counters 12 and 14), phase-corrected by the phase correction circuit 18, are synchronized with the clock run-in signal CR. The discriminator 19 then controls the switching operation of the sampling pulse switching circuit 17 in accordance with the discrimination result.

Reference numeral 21 denotes a gate signal generator for generating the first and second clock run-in gate signals G1 and G2. Reference numeral 22 denotes an input terminal of a reset signal SR for resetting the JK flip-flops 122 to 127 and 141 to 145.

The operation of the sampling pulse generator according to the first embodiment of the present invention will be described with reference to FIGS. 3 to 9.

The phase correction circuit 18 produces a leading pulse P1 and a trailing pulse P2 with reference to the output signal S2 from the JK flip-flop 126, as shown in FIG. 5. The output signal S2 is referred to as reference signal, the leading pulse P1 has a pulse width of 17.5 nsec and appears 17.5 nsec before the leading edge of the signal S2. Similarly, the trailing pulse P2 has a pulse width of 17.5 nsec and appears immediately after the trailing edge of the signal S2. The leading and trailing pulses P1 and P2 are gated by the NAND gates 181 and 182 using the first clock run-in gate pulse G1 and the clock run-in signal CR as gate pulses. The first clock run-in gate signal G1 falls at the logic level "0" period of the fifth period of the clock run-in signal CR so as to extract the clock run-in signal CR from the character multiplexing signal. The pulse gated by the NAND gates 181 and 182 is used as a set signal of the JK flip-flop 126. If the phase of the reference signal S2 is delayed from that of the clock run-in signal CR, the leading pulse P1 is gated. The JK flip-flop 126 is set by the leading pulse P1. As a result, the phase of the reference signal S2 is advanced by 35 nsec (i.e., 36°) corresponding to one period of the output signal S1 from the PLL 11. However, when the phase of the reference signal S2 is advanced from the clock run-in signal CR, the trailing pulse P2 is gated, and the JK flip-flop 126 is set by the trailing pulse P2. As a result, the phase of the reference signal S2 is delayed by 35 nsec (36°). In this manner, the phase of the reference signal S2 is advanced or delayed by 35 nsec, thereby synchronizing the count operation of the first 5-stage ring counter 12 with the clock run-in signal CR. The count operation of the second 5-stage ring counter 14 can be synchronized with the clock run-in signal CR in the same manner as described above. This is because the input signals to the terminals J and K of the JK flip-flop 141 of the second 5-stage ring counter 14 are supplied from the terminals Q and $\overline{Q}$, respectively of the first 5-stage ring counter 12.

Even if a maximum phase difference between the clock run-in signal CR and the reference signal S2 is 180° (175 nsec), phase correction can be completed at the end of the fifth period of the clock run-in signal CR. The reference signal S2 is delayed from the clock run-in signal CR such that the phase difference therebetween can fall within a range of 0 to 35 nsec, as shown in FIG. 7. 35 nsec corresponds to a maximum phase error. For this reason, the first clock run-in gate signal G1 is preset to fall at the zero-crossing point of the fifth period of the clock run-in signal CR.

When phase correction is completed, the discriminator 19 discriminates whether the phase error between the clock run-in signal CR and the reference signal S2 falls within a range of 0 to 17.5 nsec or a range of 17.5 to 35 nsec. Using the output signals from the first and second 5-stage ring counters 12 and 14, the discriminator 19 generates two pulses P3 and P4 immediately before the leading edge of the reference signal S2, as shown in FIG. 6. The pulses P3 and P4 each have a pulse width of 17.5 nsec and a phase difference of 17.5 nsec. NAND gates 191 and 192 gate the pulses P3 and P4 using as gate pulses the inverted signal $\overline{CR}$ obtained by inverting the clock run-in signal CR by the inverter 20 and the second clock run-in gate signal G2, respectively. In this case, the second clock run-in gate signal G2 is used to check how the pulses P3 and P4 are gated by the inverted clock run-in signal $\overline{CR}$ when phase correction is completed and a phase relation between the reference signal S2 and the clock run-in signal CR is determined. Therefore, the second clock run-in gate signal G2 is preset to fall with a delay of 350 nsec (i.e., one period of the clock run-in signal CR) from the first clock run-in gate signal G1.

The operation of the discriminator 19 is classified into two modes corresponding to phase relations between the reference signal S2 and the clock run-in signal CR. The first mode is a case wherein the phase error between the reference signal S2 and the clock run-in signal CR falls within a range between the states respectively indicated in FIGS. 8A and 8B. In other words, the phase error between the signals S2 and CR falls within the range between 17.5 nsec and 35 nsec. In this case, only the pulse P3 of the NAND gate 191 is gated.

Figure 8A:
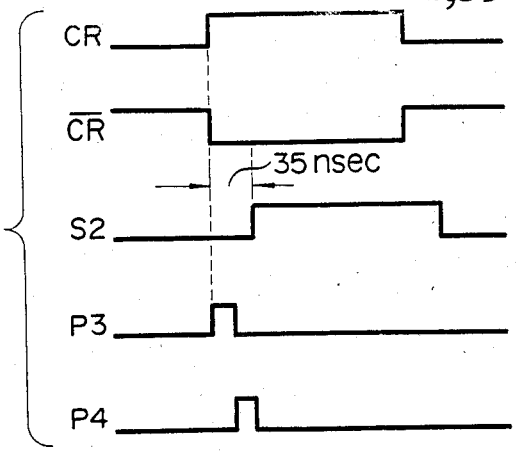
FIGS. 8A to 8C show timing charts for explaining the operation of the discriminator shown in FIGS. 1 and 2.
Figure 8B:
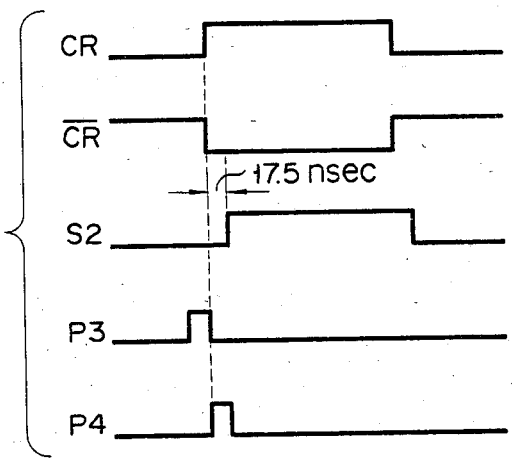
Figure 8C:
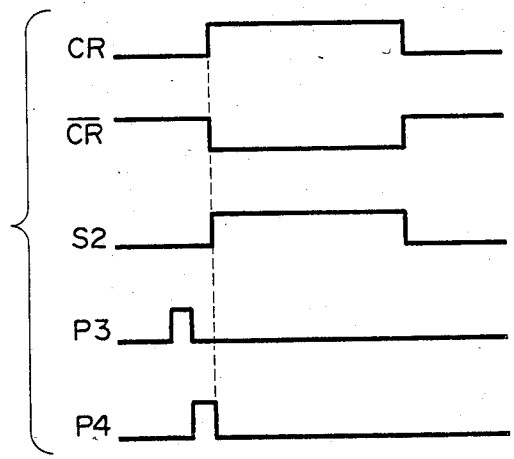

The second mode is a case wherein the phase error between the reference signal S2 and the clock run-in signal CR falls within the range between the states respectively indicated in FIGS. 8B and 8C. More particularly, the phase error falls within a range between 0 and 17.5 nsec. In this case, the pulses P3 and P4 respectively supplied to the NAND gates 191 and 192 are gated.

The pulse P3 gated by the NAND gate 191 is used as a set signal for the JK flip-flop 193. Similarly, the pulse P4 gated by the NAND gate 192 is used as a reset signal for the JK flip-flop 193. For these reasons, the states of the output from the JK flip-flop 193 are classified into two output modes in accordance with the phase error between the reference signal S2 and the clock run-in signal CR. When the phase error falls within the range between 17.5 nsec and 35 nsec, the JK flip-flop 193 is set in response to the pulse P3 from the NAND gate 191, so that the output signal from the terminal Q thereof goes to logic level "1". On the other hand, when the phase error falls within the range between 0 and 17.5 nsec, the JK flip-flop 193 is set in response to the pulse P3 from the NAND gate 191, but is then reset in response to the pulse P4 from the NAND gate 192. Therefore, the signal from the terminal Q of the JK flip-flop 193 goes to logic level "0".

The output signals from the terminals Q and $\overline{Q}$ of the JK flip-flop 193 are supplied as control signals for the sampling pulse switching circuit 17 to the NAND gates 171 and 172, respectively. One of the first and second sampling pulses SP1 and SP2 from the exclusive OR gates 131 and 161 is selected in accordance with the output state of the JK flip-flop 193.

FIGS. 9A to 9D show timing charts for explaining the operation of the sampling pulse switching circuit 17. FIG. 9A shows the clock run-in signal CR. FIG. 9B shows the phases of the first and second sampling pulses SP1 and SP2 when the phase error between the reference signal S2 and the clock run-in signal CR falls within the range between 0 and 17.5 nsec. FIG. 9C shows the phases of the first and second sampling pulses SP1 and SP2 when the phase error between the reference signal S2 and the clock run-in signal CR falls within the range between 17.5 nsec and 35 nsec. FIG. 9D shows a sampling pulse SP selected by the sampling pulse switching circuit 17. Note that the phase difference between the first and second sampling pulses SP1 and SP2 is 17.5 nsec as previously described, and that in the circuit shown in FIG. 2, the first sampling pulse SP1 is delayed by 35 nsec from the reference signal S2 and the second sampling pulse SP2 is delayed by 52.5 nsec from the reference signal S2, as shown in FIG. 9B.

Now assume that the phase error between the clock run-in signal CR and the reference signal S2 falls within the range between 0 and 17.5 nsec. The JK flip-flop 193 is reset. Therefore, the sampling pulse switching circuit 17 selects the second sampling pulse SP2 as the sampling pulse SP, as indicated by the solid line in FIG. 9B. However, when the phase error falls within the range between 17.5 nsec and 35 nsec, the JK flip-flop 193 is set. Therefore, the sampling pulse switching circuit 17 selects the first sampling pulse SP1 as the sampling pulse SP, as indicated by the solid line in FIG. 9C.

When the phase of the reference signal S2 is shifted by 35 nsec, each of the first and second sampling pulses SP1 and SP2 is shifted by 35 nsec. The second sampling pulse SP2 shown in FIG. 9B has the same phase as the first sampling pulse SP1 shown in FIG. 9C. Therefore, even if the phase of the reference signal S2 is shifted by 35 nsec, the phase of the sampling pulse SP is shifted by only 17.5 nsec. In other words, since the clock run-in signal CR undergoes a phase shift during every horizontal scan period, the phase of the reference signal S2 is corrected and the signal S2 jitters inevitably. Even if the reference signal S2 jitters by 35 nsec, the jitter of the sampling pulse SP is limited to 17.5 nsec. Therefore, the character signal can always be sampled at the optimum sampling phase.

Figure 10:
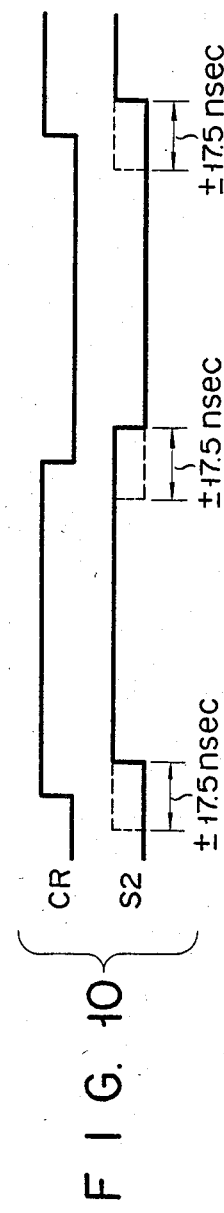
FIG. 10 is a timing chart for explaining the operation of the phase correction circuit (FIGS. 1 and 2) when the phase shift of a first clock run-in gate signal is considered.

A sampling pulse generator according to a second embodiment of the present invention will be described hereinafter. The first embodiment is an example for coping with a phase shift of the clock run-in signal CR. However, in practice, the phase of the first clock run-in gate signal G1 as well as the clock run-in signal CR is shifted. Although the phase shift in the first clock run-in gate signal G1 is constant, it may vary relative to the phase shift in the clock run-in signal CR. Furthermore, even if the clock run-in signal CR has a predetermined phase, the phase of the first clock run-in gate signal G1 itself may be shifted independently of the phase of the clock run-in signal CR. In this manner, when the phase of the clock run-in gate signal G1 is shifted, the jitter of the reference signal S2 becomes greater than that corresponding to a phase shift of 35 nsec. In order to limit the jitter of the reference signal S2 to less than 35 nsec, the first clock run-in gate signal G1 must fall during a logic level "0" period of the clock run-in signal CR. However, if the first clock run-in gate signal G1 falls in a logic level "1" period of the clock run-in signal CR, the reference signal S2 will be synchronized with the clock run-in signal CR with an error being in a range of ±17.5 nsec, as shown in FIG. 10. This is because the phase of the clock run-in signal CR comes very close to that of the reference signal S2 immediately before phase correction is completed; therefore, the phase of the reference signal S2 is delayed by 35 nsec in response to the trailing pulse P2 immediately after the phase thereof is advanced by 35 nsec in response to the leading pulse P1. However, when the first clock run-in gate signal G1 falls in a logic level "1" period of the clock run-in signal CR, phase correction is completed before the phase of the reference signal S2 is delayed in response to the trailing pulse P2. Therefore, the reference signal S2 is synchronized with the clock run-in signal CR while the phase of the reference signal S2 is advanced by a maximum of 17.5 nsec.

Figure 11:
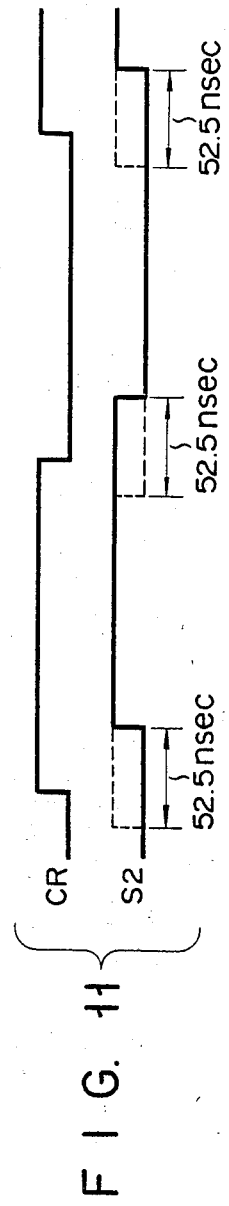
FIG. 11 is a timing chart for explaining the operation of the phase correction circuit (FIGS. 1 and 2) when the phase shift of the first clock run-in gate signal and a clock run-in signal is considered.

Therefore, the reference signal S2 receives the influence of jitters of the clock run-in signal CR and the first clock run-in gate signal G1. As a result, the reference signal S2 is subject to phase correction within a range of 52.5 nsec with respect to the phase of the clock run-in signal CR as shown in FIG. 11. 52.5 nsec corresponds to a maximum phase error.

In general, the first clock run-in gate signal G1 is prepared such that the counter is reset by a horizontal sync signal SH shown in FIG. 4 and the count is held at logic level "1" throughout the five periods of the clock run-in signal CR. However, as previously described, the phase of the clock run-in gate signal G1 varies within a range of ±0.35 μsec for every horizontal scan period. Therefore, it is difficult to preset the trailing edge of the first clock run-in gate signal G1 in a logic level "1" period of the clock run-in signal CR.

Figure 13:
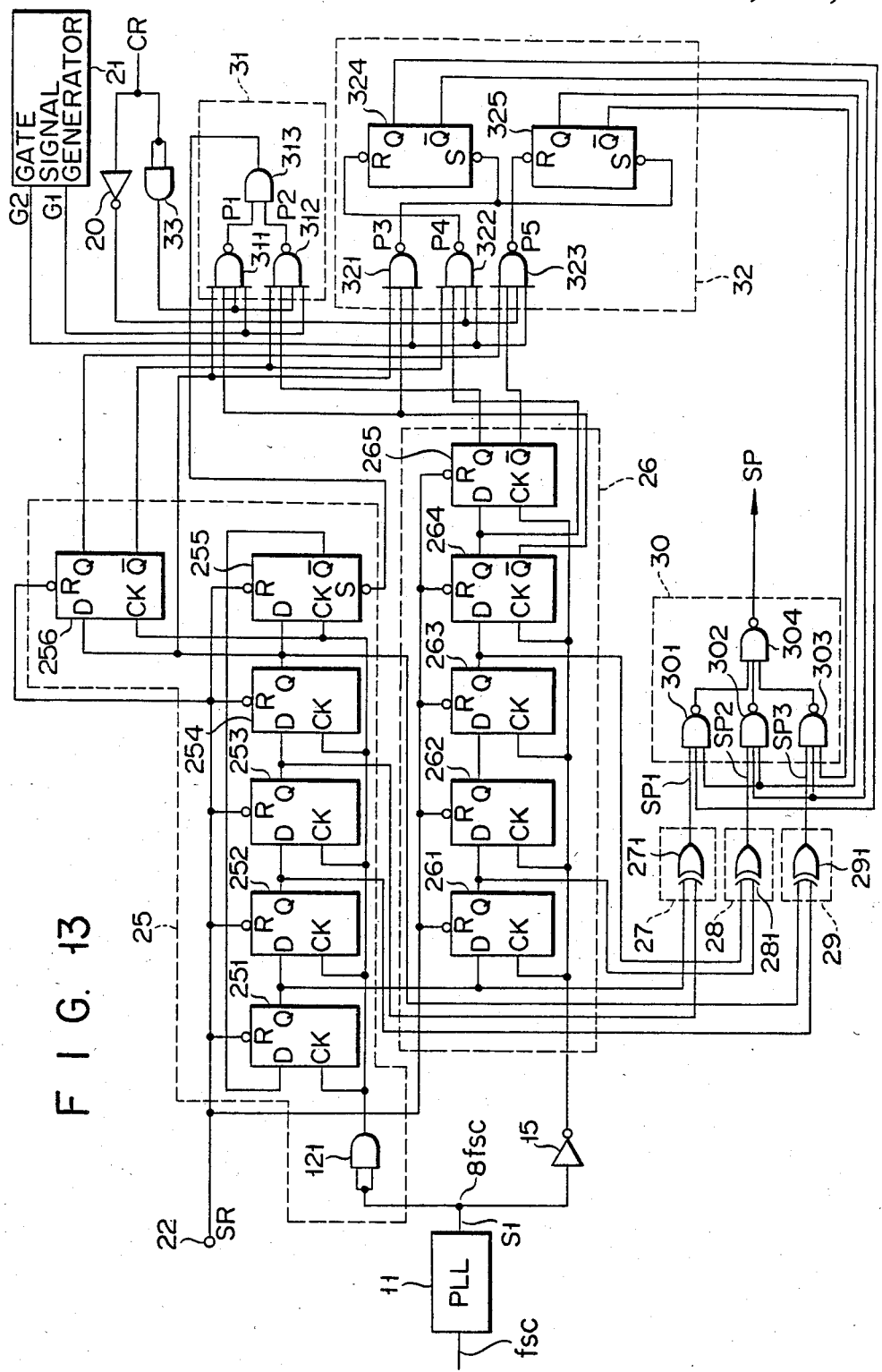
FIG. 13 is a circuit diagram showing the detailed configuration of sampling output circuits shown in FIG. 12.

In the second embodiment, influence of the phase shift in the first clock run-in gate signal G1 as described above is completely eliminated. FIG. 12 is a block diagram of a sampling pulse generator of the second embodiment, and FIG. 13 is a circuit diagram showing the detailed configuration thereof.

The configuration and operation of the sampling pulse generator according to the second embodiment will be described with reference to FIG. 13 so as to best understand the present invention. A first 5-stage ring counter 25 has D flip-flops 251 to 256 in place of the JK flip-flops, but has substantially the same function as the first 5-stage ring counter 12 shown in FIG. 2. A second 5-stage ring counter 26 comprises D flip-flops 261 to 265 and has substantially the same function as the second 5-stage ring counter 14 shown in FIG. 2. First to third sampling pulse output circuits 27 to 29 comprise exclusive OR gates 271, 281 and 291, respectively. The first sampling pulse output circuit 27 receives output signals from terminals Q of the D flip-flops 251 and 253 and generates a first sampling pulse SP1 having a frequency of $(8/5)f_{SC}$. The second sampling pulse output circuits 28 receive output signals from the terminals Q of the D flip-flops 261 and 263 and produce second sampling pulses SP2 having a frequency of $(8/5)f_{SC}$. The third sampling pulse output circuit 29 receives output signals from terminals Q of the D flip-flop 252 and 254 and produce third sampling pulses SP3 having a frequency of $(8/5)f_{SC}$.

Reference numeral 30 denotes a sampling pulse switching circuit for selecting one of the first to third sampling pulses SP1 to SP3. The sampling pulse switching circuit 30 comprises four NAND gates 301 to 304. A phase correction circuit 31 serves to lock the phase of the reference signal S2 with that of the clock run-in signal CR. The phase correction circuit 31 comprises NAND gates 311 and 312 and an AND gate 313, and has substantially the same function as the phase correction circuit 18 of the first embodiment. A discriminator 32 comprises NAND gates 321 and 323, and RS flip-flops 324 and 325. The discriminator 32 serves to discriminate the phase relationship between the reference signal S2 and the clock run-in signal CR in the same manner as does the discriminator 19 of the first embodiment. However, in consideration of the fact that the reference signal S2 is phase-corrected within a range of 52.5 nsec with respect to the phase of the clock run-in signal CR due to a phase shift in the first clock run-in gate signal G1 and the clock run-in signal CR, the discriminator 32 has 3 discrimination periods while the discriminator 19 has 2 discrimination periods. Note that an AND gate 33 is inserted in a transmission line of the clock run-in signal CR.

The operation of the sampling pulse generator of the second embodiment will now be described. Phase correction is performed in the same manner as in the first embodiment shown in FIG. 2. More particularly, the phase correction circuit 31 prepares leading and trailing pulses P1 and P2 which are then selectively gated in response to the clock run-in signal CR. Phase correction is performed when the fifth D-flip-flop 255 of the 5-stage ring counter 25 is set in response to the gated leading pulse P1 or the gated trailing pulse P2. When phase correction is completed, the reference signal S2 is synchronized with the clock run-in signal CR within a range between −17.5 nsec and +35 nsec (52.5 nsec) with respect to the phase of the clock run-in signal CR, as shown in FIG. 11.

Figure 14:
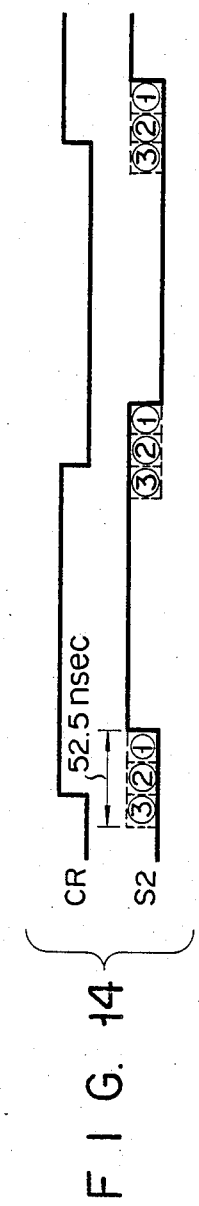
FIG. 14 is a timing chart for explaining the operation of a discriminator shown in FIGS. 12 and 13.

In the circuit shown in FIGS. 11 and 12, the range of 52.5 nsec is divided into three discrimination periods ①, ②, and ③, each of 17.5 nsec as shown in FIG. 14. When phase correction is completed, the discriminator 32 discriminates in which one of the discrimination period ①, ②, or ③ the leading edge of the reference signal S2 occurs. The discriminator 32 produces pulses P3, P4 and P5 in the vicinity of the leading edge of the reference signal S2, as shown in FIG. 15. Each of the pulses has a pulse width of 17.5 nsec. The pulse P3 is prepared such that the output signal from the terminal Q of the D flip-flop 254 and the output signal from the terminal $\overline{Q}$ of the D flip-flop 264 are logic-NANDed by the NAND gate 321. The pulse P4 is prepared such that the output signal from the terminal $\overline{Q}$ of the D flip-flop 256 and the output signal from the terminal Q of the D flip-flop 264 are logic-NANDed by the NAND gate 322. The pulse P5 is prepared such that the output signal from the terminal Q of the D flip-flop 256 and the output signal from the terminal $\overline{Q}$ of the D flip-flop 265 are logic-NANDed by the NAND gate 323. In this case, the pulse P3 is gated by the second clock run-in gate signal G2, while the pulses P4 and P5 are gated by a signal $\overline{CR}$ obtained by inverting the clock run-in signal CR by the inverter 20 and the second clock run-in gate signal G2. The pulse P3 is supplied to the set terminals of the RS flip-flops 324 and 325. The pulse P4 is supplied to the reset terminal of the RS flip-flop 324. The pulse P5 is supplied to the reset terminal of the RS flip-flop 325. As a result, when the leading edge of the reference signal S2 occurs in discrimination period ① (i.e., when the leading edge of the reference signal S2 falls within a range between states respectively indicated in FIG. 16A and FIG. 16B), only the pulse P3 is gated by the NAND gate 321 and is supplied to the RS flip-flops 324 and 325. The output signals from the terminals Q of the RS flip-flops 324 and 325 go to high level. When the leading edge of the reference signal S2 falls within the discrimination period ② (i.e., when the leading edge of the reference signal S2 falls within a range between states respectively indicated in FIG. 16B and FIG. 16C), the pulses P3 and P4 are gated by NAND gates 321 and 322, respectively. As a result, the pulse P3 is supplied to the RS flip-flops 324 and 325, while the pulse P4 is supplied to the RS flip-flop 324. The output signals from the terminal Q of the RS flip-flops 324 and 325 are set at low level and high level, respectively. When the leading edge of the reference signal S2 falls within the discrimination period ③ (i.e., when the leading edge of the reference signal falls within a range between states respectively indicated in FIG. 16C and FIG. 16D), the pulses P3, P4 and P5 are gated by the NAND gates 321, 322 and 323, respectively. As a result, the pulse P3 is supplied to both the RS flip-flops 324 and 325, while the pulses P4 and P5 are respectively supplied to the RS flip-flops 324 and 325. The output signals from terminal Q of the RS flip-flops 324 and 325 are set at low level.

Figure 18A:
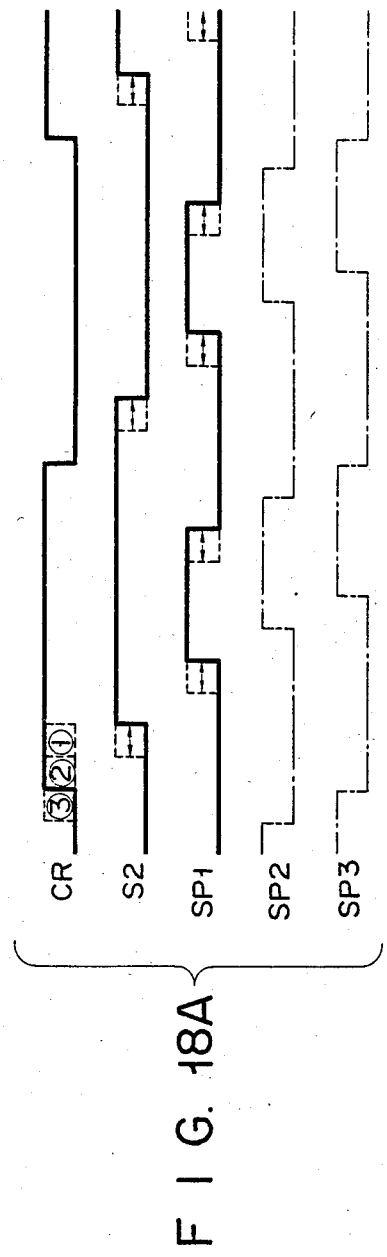
Figure 18B:
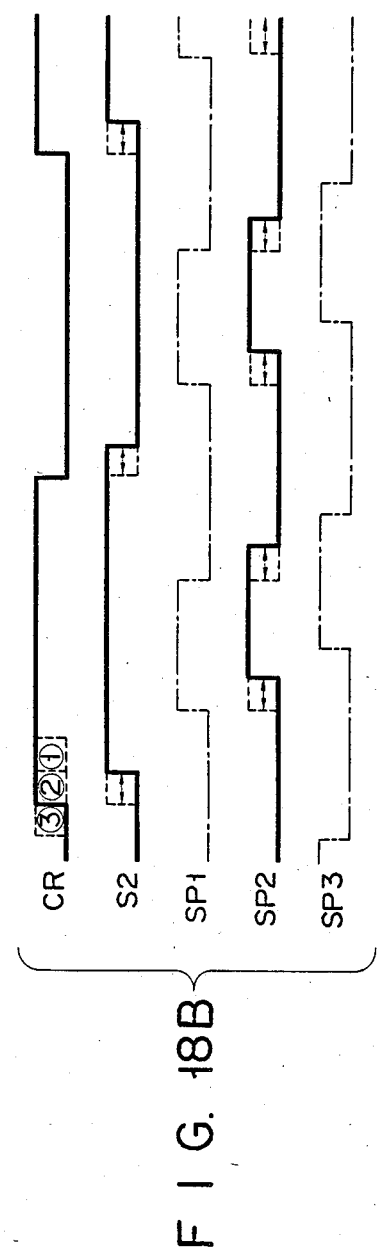

The output signals from the output terminals Q of the RS flip-flops 324 and 325 are set at levels ("H", "H"), ("L", "H") or ("L", "L") in accordance with whether the leading edge of the reference signal S2 falls within the discrimination period ①, ②, or ③. The first to third sampling pulses SP1, SP2 and SP3 having a 17.5 nsec phase difference from each other are generated by the exclusive OR gates 271, 281 and 291, respectively. A given one of the first to third sampling pulses SP1, SP2 and SP3 is selected by the sampling pulse switching circuit 30 in accordance with the fact that the leading edge of the reference signal S2 falls within a corresponding one of the discrimination periods ①, ② and ③ (i.e., in accordance with the output state of the RS flip-flops 324 and 325). When the leading edge of the reference signal S2 falls within the discrimination period ①, the phase delay of the reference signal S2 is greatest with respect to the clock run-in signal CR, and the first sampling pulse SP1, which is most advanced, is selected as the sampling pulse SP, as shown in FIG. 18A. When the leading edge of the reference signal S2 falls within the discrimination period ②, the second sampling pulse SP2 is selected, as shown in FIG. 18B. When the leading edge of the reference signal S2 falls within the discrimination period ③, the third sampling pulse SP3 is selected, as shown in FIG. 18C.

When the phase of the reference signal S2 is shifted by 52.5 nsec, each of the first to third sampling pulses SP1 to SP3 is shifted by 52.5 nsec. However, the first sampling pulse SP1 in FIG. 18A, the second sampling pulse SP2 in FIG. 18B, and the third sampling pulse SP3 in FIG. 18C have the same phase. Therefore, even if the phase of the reference signal S2 is shifted by 52.5 nsec, the phase of the sampling pulse SP is shifted by only 17.5 nsec, as shown in FIG. 18D. In other words, even if the jitter of the reference signal S2 corresponds to 52.5 nsec due to a phase shift in the clock run-in signal CR and the first clock run-in gate signal G1, the jitter of the sampling pulse SP is limited to 17.5 nsec. The sampling precision of the circuit of the second embodiment is doubled with respect to that of the first embodiment (FIG. 2).

According to the second embodiment, since the leading edge of the first clock run-in gate signal G1 need not be forcibly synchronized with a discrimination period during which the clock run-in signal CR is set at logic level "0", the circuit configuration is simplified.

The present invention is not limited to these particular embodiments. Various changes and modifications may be made within the spirit and scope of the present invention. For example, the present invention may, of course, be applied to any circuit other than the sampling pulse generator of the character/TV signal multiplex reception apparatus.

What is claimed is:

1. A sampling pulse generator comprising:
signal output means for generating a first signal having a predetermined frequency;
a first ring counter coupled to said signal output means and driven by the first signal so as to produce a second signal obtained by frequency-dividing the first signal at a predetermined frequency dividing ratio;
inverting means, coupled to said signal output means, for inverting the first signal and providing an inverted signal;
a second ring counter coupled to said inverting means and driven by said inverted signal so as to produce a third signal obtained by frequency-dividing the inverted signal at a predetermined frequency dividing ratio;
sampling pulse output means, coupled to said first and said second ring counters, for producing a plurality of sampling pulses for sampling a signal to be sampled, the sampling pulses being obtained using the second and third signals such that the sampling pulses are phase-shifted by half a period of the first signal;
pulse generating means for generating a pulse having a predetermined level during a predetermined period of the signal to be sampled;
phase correcting means, coupled to said first and said second ring counters and to said pulse generating means, for performing phase correction so as to synchronize a count operation of said first and second ring counters with the signal to be sampled during a period of the pulse from said pulse generating means, the phase correction being performed such that the phases of the second and third signals are shifted in units of the period of the first signal so as to cause the second and third signals to have a first predetermined phase relationship between them, and each to have a second predetermined phase relationship with the signal to be sampled;
discriminating means, coupled to said first and said second ring counters and to said pulse generating means, for setting a plurality of discrimination periods obtained by dividing a maximum phase error against said second predetermined relationship between the second or the third signal and the signal to be sampled by half the period of the first signal when the phase correction by said phase correction means is completed, and for discriminating which one of the plurality of discrimination periods corresponds to a phase-corrected second signal or a phase-corrected third signal; and
sampling pulse selecting means, coupled to said sampling pulse output means and to said discriminating means, for selecting a sampling pulse among the plurality of sampling pulses which has an optimal phase for sampling the signal to be sampled according to a discrimination result.

2. A sampling pulse generator according to claim 1, wherein said discriminating means comprises:
a gate section for selectively gating a plurality of pulses in response to the signal to be sampled, said plurality of pulses being generated in the vicinity of an edge of said second signal or said third signal, said plurality of pulses having phases shifted from each other by half the period of said first signal; and
a flip-flop section coupled to said gate section and selectively set and reset by gated pulses from said gate section so as to produce a discrimination signal indicating which one of the pluarlity of discrimination periods corresponds to the second signal or the third signal.

* * * * *

UNITED STATES PATENT AND TRADEMARK OFFICE
CERTIFICATE OF CORRECTION

PATENT NO. : 4,594,516
DATED : Jun. 10, 1986
INVENTOR(S) : Shigenori TOKUMITSU

It is certified that error appears in the above-identified patent and that said Letters Patent is hereby corrected as shown below:

ON THE TITLE PAGE:

Change "[30]   Foreign Application Priority Data

Jul. 30, 1982 [JP] Japan...........59-133572" to

--[30]   Foreign Application Priority Data

Jul. 30, 1982 [JP] Japan...........57-133572--.

Signed and Sealed this

Twenty-seventh Day of January, 1987

*Attest:*

DONALD J. QUIGG

*Attesting Officer*   *Commissioner of Patents and Trademarks*